US009070675B2

(12) United States Patent
So et al.

(10) Patent No.: US 9,070,675 B2
(45) Date of Patent: Jun. 30, 2015

(54) PLATING STRUCTURE FOR WAFER LEVEL PACKAGES

(71) Applicants: Kwang Sup So, Seoul (KR); No Sun Park, Gyeonggi-do (KR)

(72) Inventors: Kwang Sup So, Seoul (KR); No Sun Park, Gyeonggi-do (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 13/973,492

(22) Filed: Aug. 22, 2013

(65) Prior Publication Data

US 2014/0070408 A1  Mar. 13, 2014

(30) Foreign Application Priority Data

Sep. 12, 2012  (KR) .......................... 10-2012-0100857

(51) Int. Cl.

| H01L 23/498 | (2006.01) |
|---|---|
| H01L 21/768 | (2006.01) |
| H01L 23/31 | (2006.01) |
| H01L 23/00 | (2006.01) |
| H01L 23/525 | (2006.01) |

(52) U.S. Cl.

CPC .... *H01L 23/49811* (2013.01); *H01L 21/76885* (2013.01); *H01L 24/11* (2013.01); *H01L 2224/0401* (2013.01); *H01L 2224/94* (2013.01); *H01L 23/3114* (2013.01); *H01L 23/525* (2013.01); *H01L 2224/05569* (2013.01); *H01L 23/562* (2013.01); *H01L 23/564* (2013.01); *H01L 24/03* (2013.01); *H01L 24/05* (2013.01); *H01L 24/13* (2013.01); *H01L 2224/02313* (2013.01); *H01L 2224/0345* (2013.01); *H01L 2224/03462* (2013.01); *H01L 2224/0347* (2013.01); *H01L 2224/0361* (2013.01); *H01L 2224/03901* (2013.01); *H01L 2224/05008* (2013.01); *H01L 2224/05571* (2013.01); *H01L 2224/05644* (2013.01); *H01L 2224/05647* (2013.01); *H01L 2224/05655* (2013.01); *H01L 2224/11334* (2013.01); *H01L 2224/11849* (2013.01); *H01L 2224/131* (2013.01); *H01L 2224/03914* (2013.01); *H01L 2224/03903* (2013.01); *H01L 2224/02311* (2013.01); *H01L 2924/00014* (2013.01); *H01L 2924/3841* (2013.01)

(58) Field of Classification Search

USPC ........................................................ 257/779

See application file for complete search history.

(56) References Cited

U.S. PATENT DOCUMENTS 7,977,783 B1 * 7/2011 Park et al. ..................... 257/692

* cited by examiner

*Primary Examiner* — Stephen W Smoot

(74) *Attorney, Agent, or Firm* — McAndrews, Held & Malloy

(57) ABSTRACT

A plating structure for wafer level packages are disclosed and may include a semiconductor wafer comprising a plurality of semiconductor die and a plating structure for forming an under bump metal on redistribution layers on the plurality of semiconductor die. The plating structure may comprise a plating connection line around a periphery of the semiconductor wafer, and a plating bar coupling the plating connection line to plating traces on the plurality of semiconductor die. The plating traces may be electrically coupled to the redistribution layers on the plurality of semiconductor die. The semiconductor wafer may comprise a reconstituted wafer of said semiconductor die. The semiconductor wafer may comprise a wafer prior to singulating the plurality of semiconductor die. The plating bar may be located in a sawing line for the singulating of the plurality of semiconductor die. A passivation layer may cover the redistribution layer and the plating traces.

20 Claims, 6 Drawing Sheets

PLATING STRUCTURE FOR WAFER LEVEL PACKAGES

CROSS REFERENCE TO RELATED APPLICATIONS

The present application makes reference to, claims priority to, and claims the benefit of Korean Patent Application No. 10-2012-0100857, filed on Sep. 12, 2012, the contents of which are hereby incorporated herein by reference, in their entirety.

FIELD OF THE INVENTION

Certain embodiments of the invention relate to semiconductor chip packaging. More specifically, certain embodiments of the invention relate to a plating structure for wafer level packages.

BACKGROUND OF THE INVENTION

A semiconductor package is used in a variety of products. According to the recent tendency toward lightweight, slim and compact products, in order to downsize semiconductor packages, flip chip packages or TSV packages are drawing attention. In the flip chip package, a solder bump is directly formed on a surface of a semiconductor die. In the TSV package, a through silicone via (TSV) is formed on a bond pad of a semiconductor die, and a solder bump is formed on the TSV.

The flip chip package and the TSV package generally include a redistribution layer (RDL) connected to a bond pad of a semiconductor die to redistribute portions to be connected to a solder bump and an under bump metal (UBM) connected to the RDL to increase bonding strength with the solder bump.

Further limitations and disadvantages of conventional and traditional approaches will become apparent to one of skill in the art, through comparison of such systems with the present invention as set forth in the remainder of the present application with reference to the drawings.

Field of the Invention

The present invention relates to a plating structure for manufacturing a wafer level package and a method of manufacturing the wafer level package by using the same, which is capable of reducing the number of processes for manufacturing a under-bump-metal(UBM) while they proceeding in the post-treatment process, by further extending the plating structure to the outside of a chip during the plating of a redistribution layer.

BRIEF SUMMARY OF THE INVENTION

A semiconductor package and manufacturing method therefore, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a semiconductor package and manufacturing method thereof. Example aspects of the invention may comprise a semiconductor wafer comprising a plurality of semiconductor die and a plating structure for forming an under bump metal on redistribution layers on the plurality of semiconductor die. The plating structure may comprise a plating connection line around a periphery of the semiconductor wafer, and a plating bar coupling the plating connection line to plating traces on the plurality of semiconductor die. The plating traces may be electrically coupled to the redistribution layers on the plurality of semiconductor die. The semiconductor wafer may comprise a reconstituted wafer of said semiconductor die. The semiconductor wafer may comprise a wafer prior to singulating the plurality of semiconductor die. The plating bar may be located in a sawing line for the singulating of the plurality of semiconductor die. A passivation layer may cover the redistribution layer and the plating traces. The under bump metal may be formed in an opening in the passivation layer. The plating structure may comprise an electrode terminal for a plating process for forming the under bump metal. The under bump metal may comprise one or more of nickel, gold, and copper. An input/output terminal may be formed on the under bump metal. The input/output terminal may comprise a solder bump.

Accordingly, the present invention has been made to solve the above-mentioned problems occurring in the prior art, and the present invention provides a wafer level package and a method of manufacturing the wafer level package by using the same, which is capable of reducing the number of the sputtering process for a seed layer to be used in the formation of the typical under bump metal (UBM), the number of the patterning processes and the exposure processes involved in photoresist processing, and the number of the etching processes for the seed layer, resulting in a reduction of the manufacturing cost and manufacturing time, by simultaneously forming plating structures to be connected with a redistribution layer and a bonding pad of the chip during the plating of the redistribution layer, and by using the plating structure as a plating line for forming the UBM.

Figure 3A:
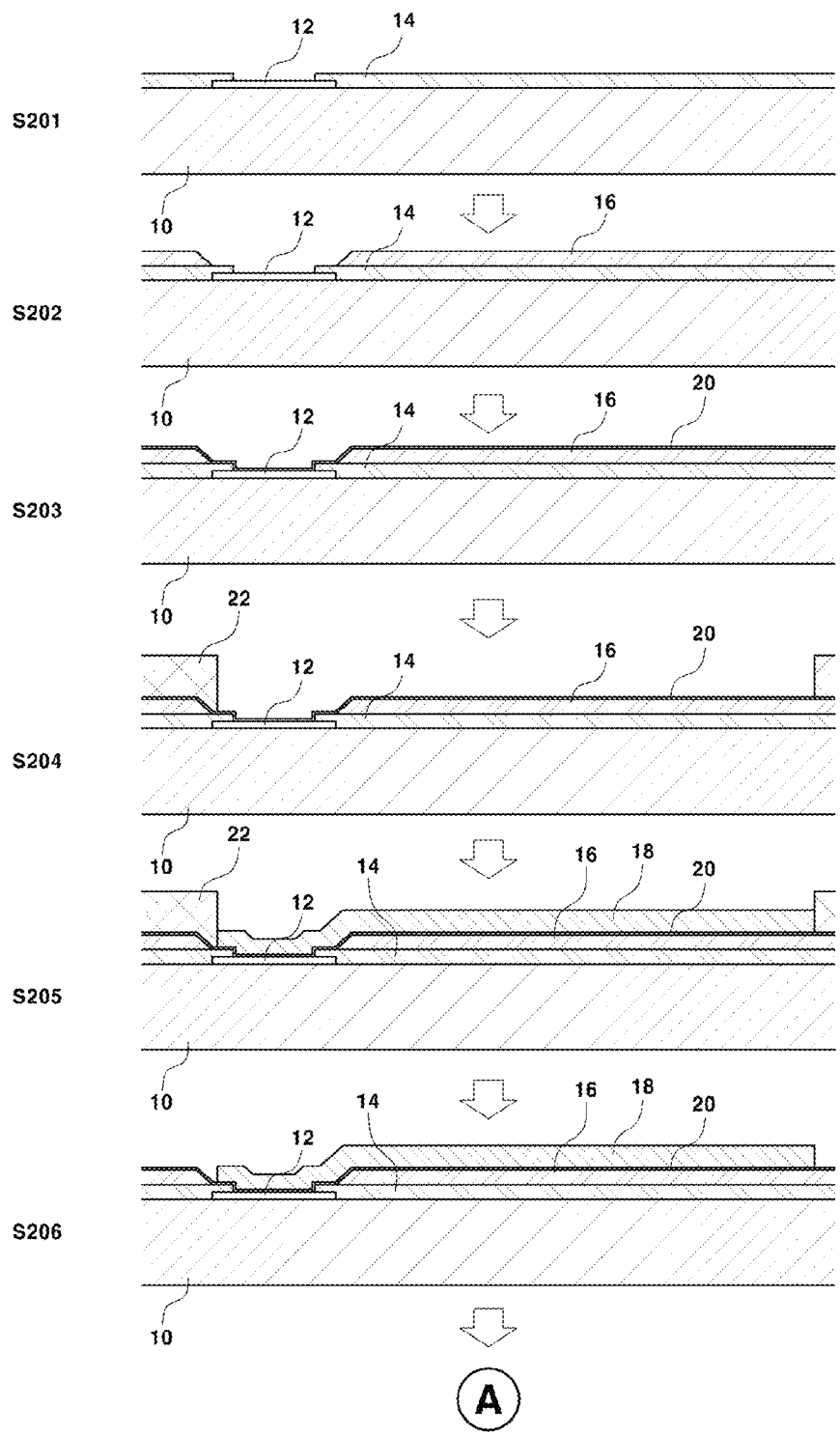
FIGS. 3a to 3c are schematic cross sectional views for showing a method of manufacturing a wafer level package according to the prior art.
Figure 3B:
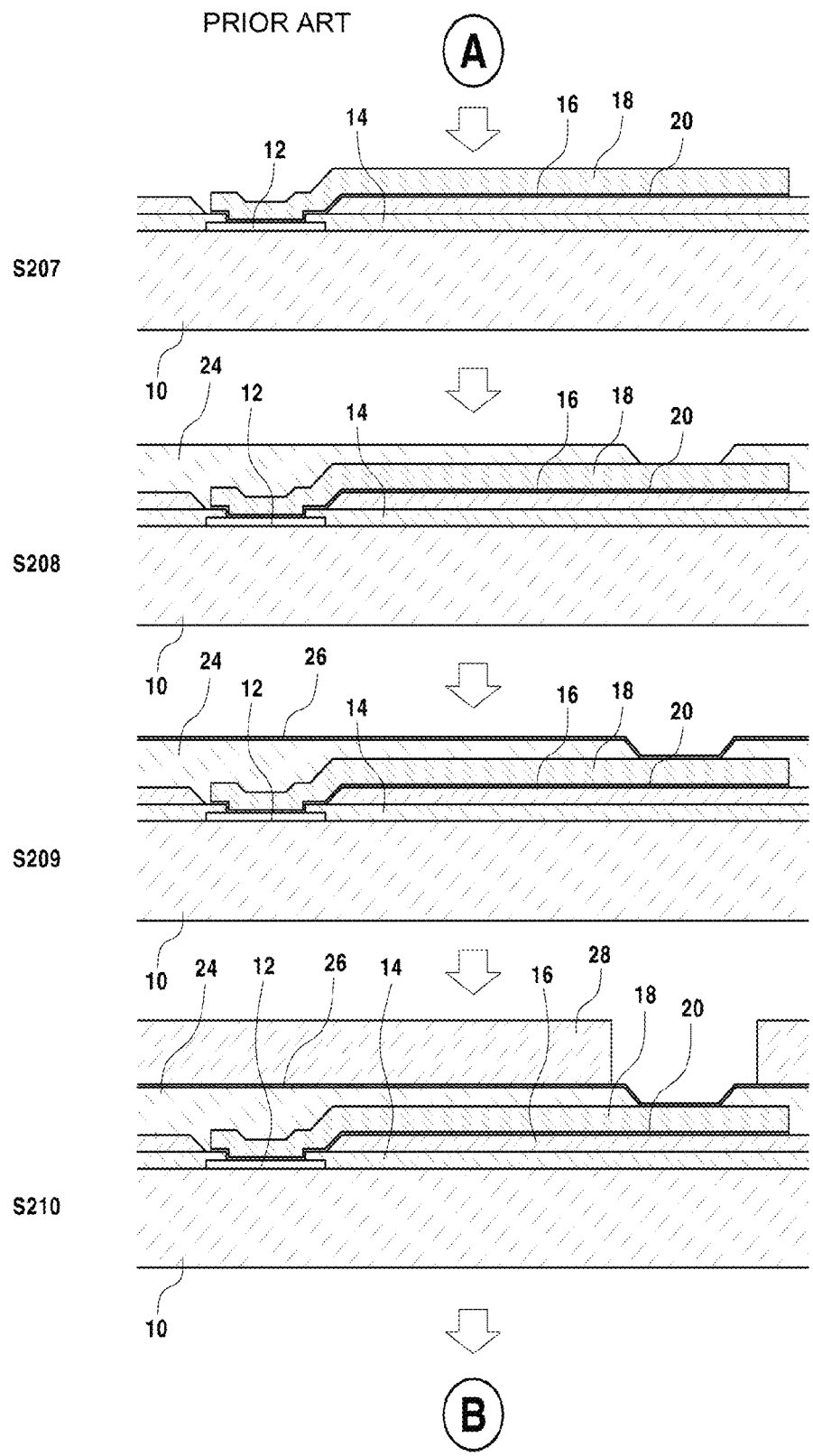
Figure 3C:
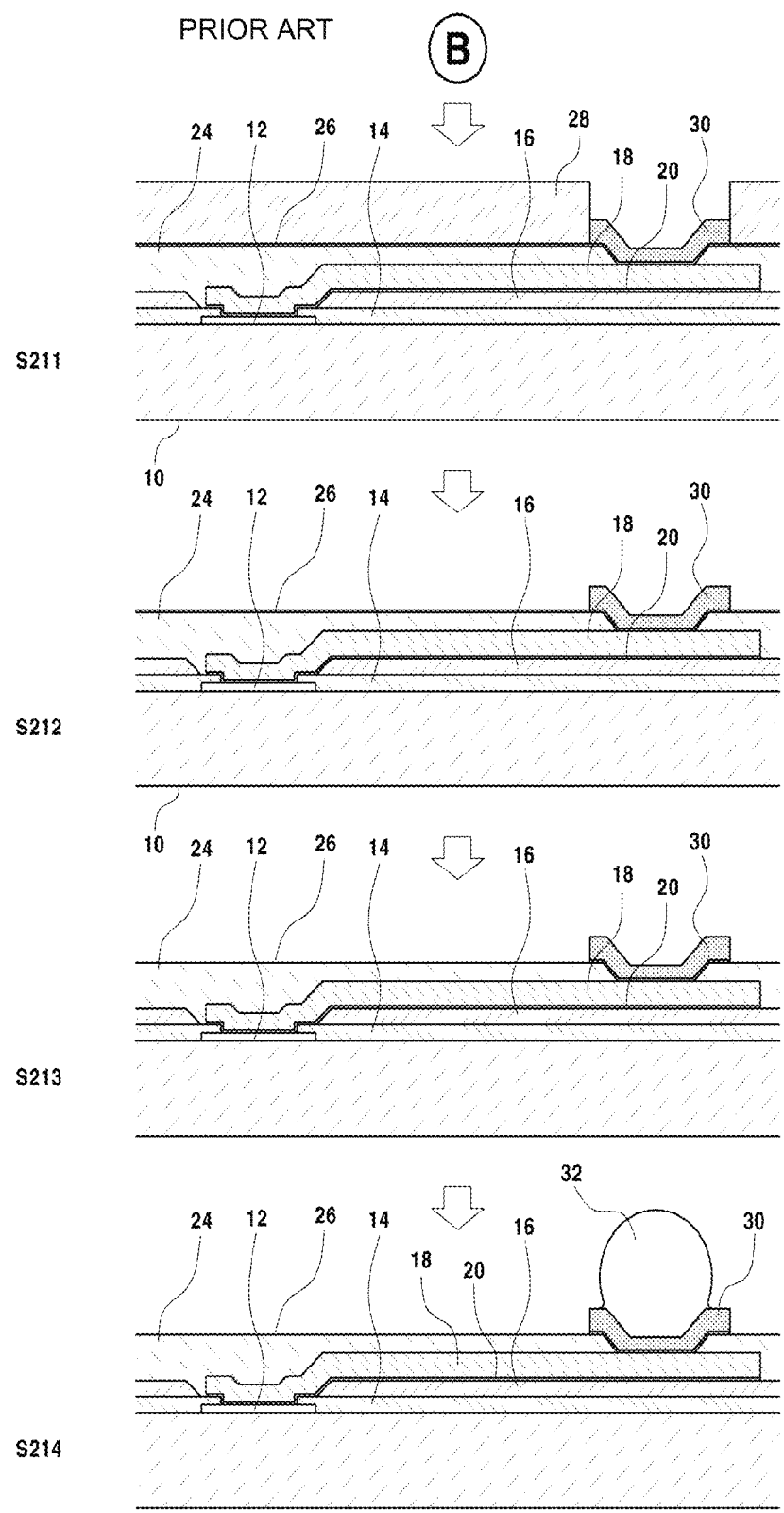

The attached drawings FIGS. 3a to 3c are sequence diagrams for showing the method of manufacturing a Wafer Level Chip Scale Package (WLCSP) according to the prior art. Hereinafter, the manufacturing process of the Wafer Level Chip Scale Package according to the prior art will be described with reference to the attached drawings.

At first, in a step of providing a wafer (step S201), a designed circuit is integrated on a semiconductor chip (10) that is still present at a wafer level. A bonding pad (12) is formed at a predetermined area on the wafer, which is corresponding to an electrical input/output path of the circuit.

Furthermore, a die passivation (14) for protecting the integrated circuit is formed over the total surface of the respective semiconductor chip (10), but is not provided on the bonding pad (12).

Next, a step of forming a first passivation film (16) so as to create a redistribution layer on the die passivation (14) proceeds (step S202). At this time, the first passivation film (16) may not be coated on a plurality of metal pads formed at an adequate arrangement, that is, on the bonding pad (12). The reason is that an end of a redistribution layer (18) is conductively connected to the bonding pad (12). At this time, the redistribution layer (18) comprises a metal distribution layer for receiving an electric voltage required to operate the circuit integrated on the semiconductor chip.

Next, a first seed layer (20) is formed on upper surfaces of the first passivation film (16) and the bonding pad (12) by using the sputtering process (step S203). At this time, the first seed layer (20) comprises a conductive line for forming the redistribution layer (18).

After the process of forming the first seed layer (20) has been completed, a first photoresist (22) is coated on the surface of the semiconductor chip (10) and then areas of the semiconductor chip (10) where the bonding pad (12) and the redistribution layer (18) may be formed, are externally exposed by performing the typical exposure and development process (step S204). At this time, the first seed layer (20) has been already formed at the exposed areas, which are corresponding to the bonding pad (12) and the redistribution layer (18).

Next, an electroplating process of forming the redistribution layer (18) at the exposed areas proceeds (step S205). To explain in detail, if an electric current is applied to the first seed layer (20) when the first seed layer (20) is dipped into a solution comprising metal ions, then the exposed areas on the surface of the first seed layer (20), which is corresponding to the bonding pad (12) and the redistribution layer (18), are plated with metal ions, thereby resulting in the formation of the redistribution layer (18).

After the electroplating process has been completed, a process of stripping the first photoresist (22) proceeds (step S206), and then a process of removing a part of the first seed layer (20), except for the other part of the first seed layer (20) down below the redistribution layer(18), proceeds by using an etching process (step S207), thereby resulting in the completion of the redistribution layer (18) having a predetermined surface area and a predetermined length.

At this time, one end of the redistribution layer (18) is conductively connected to the bonding pad (12) and the other end of the redistribution layer (18) extends to a predetermined site on which the input/output terminal (32) such as a solder ball may be attached.

If input/output terminals, such as solder balls, are attached to the bonding pads of the respective chips that making a fine pitch there between, an electrical short may occur due to the direct contact between the input terminal and the output terminal. In order to solve this problem, the redistribution layer (18) is provided. The redistribution layer (18) comprises a metal distribution layer which extends from the bonding pad (12) to the outside so as to allow the input/output terminals (32) to be attached to the bonding pad (12) while maintaining a wider gap there between.

Next, a step of forming a second passivation film (24) on upper surfaces of the first passivation film (16) and the redistribution layer (18) proceeds (step S208). At this time, the second passivation film (24) is not provided on the other end of the redistribution layer (18) so as to allow the input/output terminal (32) to be attached thereto.

The second passivation film (24) is made of the same materials and the same method as those used in the process of forming the first passivation film (16). The second passivation layer functions to prevent moisture and other foreign substances from being permeated into the redistribution layer (18) and to prevent a mechanical shock from being transmitted to the redistribution layer (18). Also, the second passivation layer (24) functions to prevent an electrical short between the redistribution layers from being occurred.

Next, in order to form a under-bump-metal (UBM), that is, an electrode terminal made of a metal material on the other end of the redistribution layer (18) by using the plating structure (40), a second seed layer (26) is formed over the surface of the exposed other end of the redistribution layer (18) and the second passivation film (24) by performing the sputtering process (step S209).

After the second seed layer (26) has been formed, a second photoresist (28) is coated over the upper surfaces of the other end of the redistribution layer (18) and the second passivation film (24) and thereafter the other end of the redistribution layer (18) is externally exposed by performing an exposure and development process (step S210).

As with the step of forming the redistribution layer (18) on the first seed layer (20) by using the plating process, if an electric current is applied to the second seed layer (26), then the exposed areas on the surface of the second seed layer (26) are plated with metal ion. That is, the UBM (30) is formed on the surface of the second seed layer (26), which is externally exposed at the redistribution layer (18). At this time, the UBM (30) functions as a pad for allowing the input/output terminal to be easily melted and attached to the surface of the second seed layer (26). The UBM (30) is made of nickel or gold, which can be easily connected to the input/output terminal such as the solder ball. Alternatively, the UBM (30) can be formed as a thick layer by using copper plating.

Next, the second photoresist (28) may be stripped (step S212), and then the second seed layer (26) is removed except for a part of the second seed layer (26) down below the UBM (30) utilizing an etching process (step S213). As a result, the UBM(30) may be formed at a predetermined site where the input/output terminal (32) such as a solder ball may be attached.

Finally, the input/output terminal (32), such as the solder ball, may be melted and then attached to the UBM(30) in step S214, and thereby resulting in the completion of the Wafer Level Package.

However, one drawback of such known method is that there are too many of steps in the manufacturing process of the Wafer Level Package. Another drawback of the above described method is that a lot of time may be spent in the manufacture of the Wafer Level Package. It has been proved to be uneconomical to manufacture the Wafer Level Package as described above.

For example, in the manufacturing process of the Wafer Level Package according to the prior art, it is necessary to perform the sputtering process at two times for the purpose of forming the first seed layer for plating the redistribution layer and the second seed layer for plating the UBM; the PI patterning process for the first photoresist and the typical exposure and development process; the PI patterning process for the second photoresist and the typical exposure and development process; the stripping process for removing the first and second photoresists at two times after performing the patterning process; and the etching process for removing the first and second seed layers at two times. Accordingly, it is essential that a large number of the manufacturing processes are performed in the above described process. Also, the production time of the Wafer Level Package is too long, leading to a large increase of the manufacturing cost.

More particularly, in order to form the UBM for melting and attaching the input/output terminals, such as the solder ball, at a predetermined site, it is required to make the second seed layer for plating, apply the second photoresist to the surface of the second passivation film, and to perform the exposure and development process, thereby resulting in the increased number of the manufacturing processes and of the manufacturing cost.

In accordance with an aspect of the present invention, there is provided a plating device for manufacturing a Wafer Level Package, comprising: a plating structure to be used in a process of plating a UBM, which may comprise a post-treatment process in forming a redistribution layer in Wafer Level Semiconductor Package, wherein the plating structure may extend from a bonding pad of the respective chip that is a reconstituted wafer or from the redistribution layer to a sawing line of a wafer at the same time as the plating of the redistribution layer.

The plating structure comprises a plating trace extending from the bonding pad of the chip or the redistribution layer through and beyond an edge of the chip to the sawing line of the wafer; and a plating bar extending along the sawing line of the wafer and integrally connecting each respective plating trace together. In an example embodiment of the invention, the plating structure further comprises a plating connection line being integrally connected with the plating bar and extending along the edge of the wafer.

In accordance with another aspect of the present invention, there is provided a method of manufacturing a Wafer Level Package by using a plating device for manufacturing a Wafer Level Package, comprising the steps of: providing a wafer; forming a first passivation film on a surface of the respective chip that is a reconstituted wafer, except for a bonding pad; forming a first seed layer for redistribution plating on upper surfaces of the first passivation film and the bonding pad; exposing the bonding pad of the chip, an area on which the redistribution layer may be formed, and an area on which the plating structure may be formed, by performing the exposure and development process, after coating a first photoresist over the surface of the first passivation film. The redistribution layer may be formed on a part of the first seed layer, which may be on the exposed bonding pad of the chip and the area on which the exposed redistribution layer may be formed, and at the same time forming the plating structure on the other part of the first seed layer, which may be on the area on which the plating structure may be formed, due to the use of the electroplating process. A portion of the first seed layer may be removed, except for the other portion of the first seed layer below the redistribution layer and the plating structure. A second passivation film may be applied on other areas of the chip, except for one end of the redistribution layer on which a UBM may be formed, and the end of the redistribution layer with the UBM that is a metallic electrode terminal may be plated by applying an electrical current to the plating structure.

Preferably, the UBM may comprise a conductive metal selected from the group consisting of nickel, gold and copper. The conductive metal may be suitable to combine with an input/output terminal such as a solder ball as a metallic bond. The plating bar may be removed together with a part of the plating trace of the plating structure by sawing the respective chip that is a reconstituted wafer along the sawing line.

As described above, in the manufacturing process of the wafer level package according to the present invention, the number of sputtering processes may be reduced for a seed layer to be used in the formation of the UBM, the number of the patterning processes and the exposure processes involved in photoresist processing, as well as the number of etching processes for the seed layer, thereby resulting in the reduction of the manufacturing cost and the manufacturing time, by simultaneously forming plating structures to be connected with a redistribution layer, and a bonding pad of the chip during the plating of the redistribution layer, and by using the plating structure as a plating line for forming the UBM.

Aspects of the present invention may be applied to manufacturing processes for all types of packages, such as Wafer Level Chip Scale Package (WLCSP), Wafer Level Fan-Out Package, and Wafer Level Fan-In Package, where processes of forming a redistribution layer and a plating process may be involved.

Figure 1A:
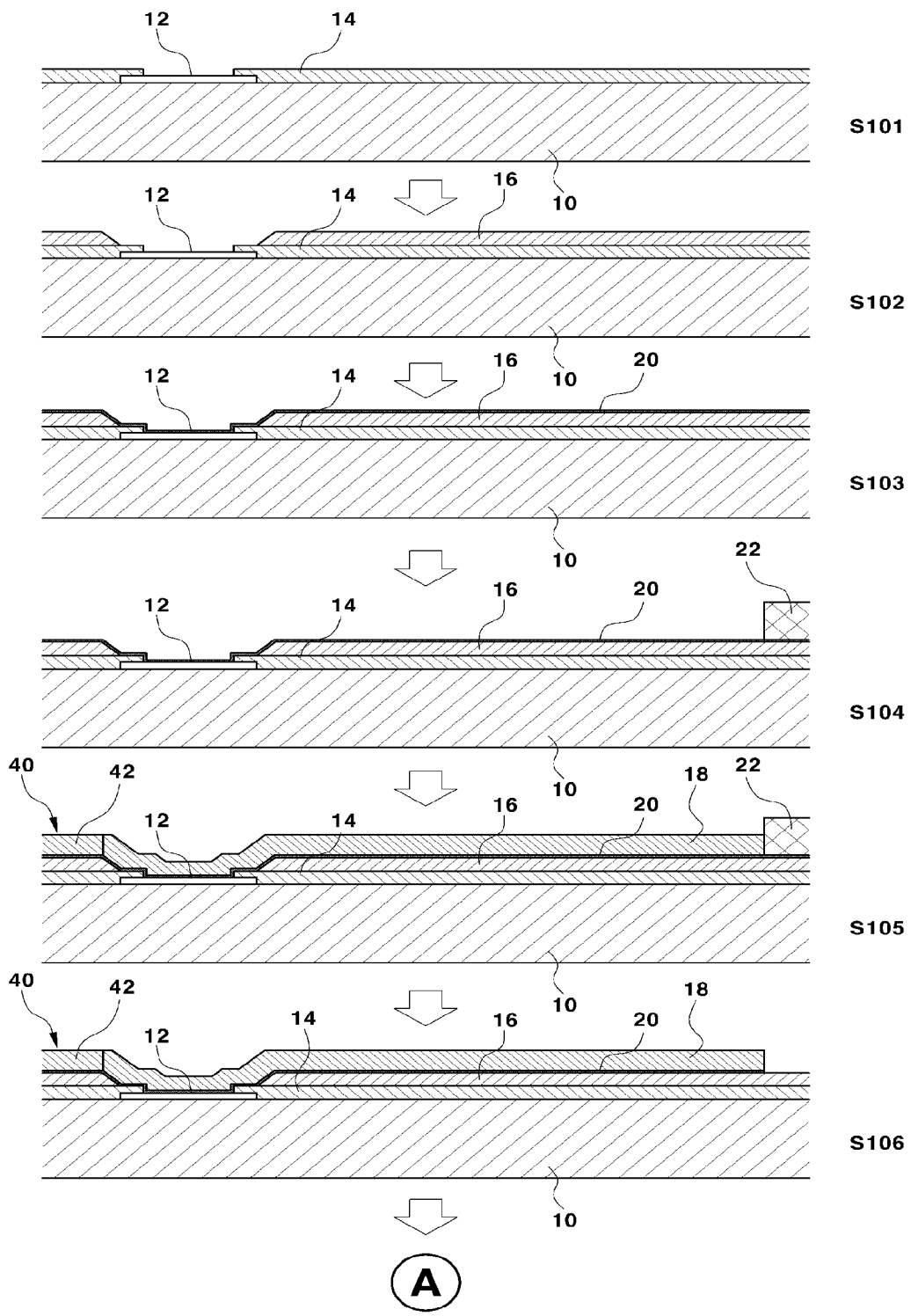
FIGS. 1a and 1b are schematic cross sectional views for showing a method of manufacturing a wafer level package by using a plating device according to an example embodiment of the present invention.
Figure 1B:
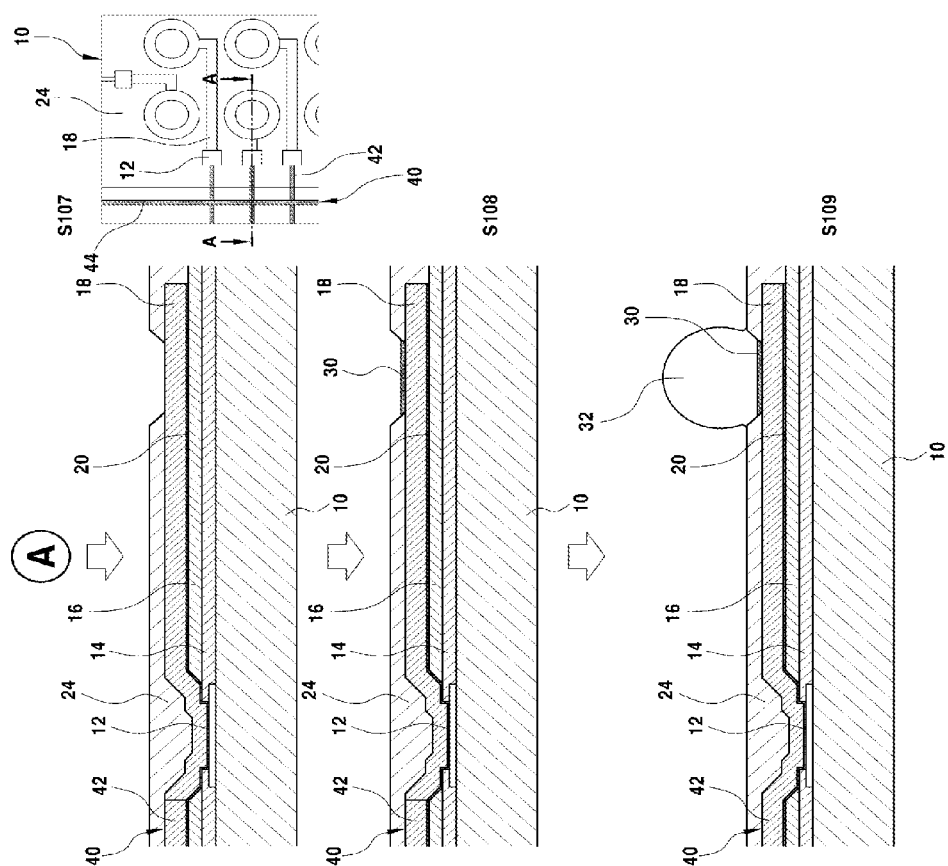

Among the attached drawings, FIGS. 1a and 1b are sequence diagrams showing the method of manufacturing a wafer level package according to an example embodiment of the present invention. In the method of manufacturing a wafer level package according to an example embodiment of the present invention, several steps from the step of providing a wafer to the step of forming a redistribution layer may be performed in the same way as those of the method of manufacturing a wafer level package described above. Hereinafter, the whole process of an example embodiment of the present invention will be explained in regular sequence for the sake of better understanding.

At first, in the step of providing a wafer (step S101), a designed circuit was integrated on a semiconductor chip (10) that may still be present at a wafer level. Furthermore, a bonding pad (12) may be formed at a predetermined area of the semiconductor chip (10), which may correspond to an electrical input/output path of the circuit.

Furthermore, a die passivation (14) for protecting the integrated circuit may be formed on the total surface of the respective semiconductor chip (10) that may be present at a wafer level. The die passivation (14) may comprise an opening for the bonding pad (12) for electrical input/output.

Next, a first passivation film (16) may be formed so as to create a redistribution layer on the die passivation (14) of the semiconductor chip (10) (step S102).

At this time, the first passivation film (16) may comprise openings on a plurality of metal pads formed in a desired arrangement, for example, on the bonding pad (12), such that an end of a redistribution layer(18) may be conductively connected to the bonding pad (12). The redistribution layer (18) may comprise a metal distribution layer for receiving an electric voltage required to operate the circuit integrated on the semiconductor chip.

Next, a first seed layer (20) may be formed on upper surfaces of the first passivation film (16) and the bonding pad (12) by using the sputtering process (step S103). At this time, the first seed layer (20) may comprise a conductive line for forming the redistribution layer (18).

Figure 2:
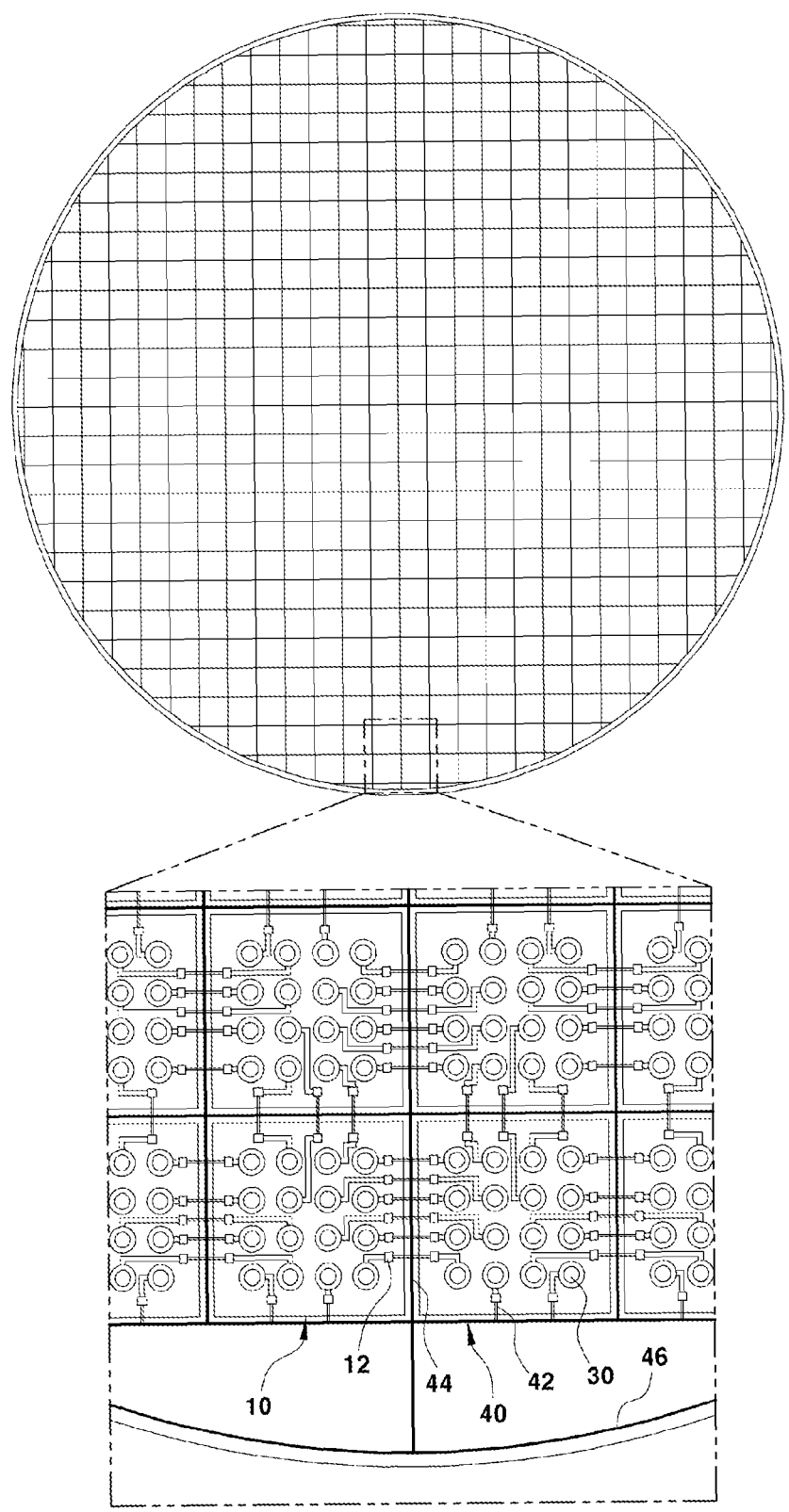
FIG. 2 is an enlarged view for showing the plating device for manufacturing the wafer level package according to an example embodiment of the present invention.

Hereinafter, the plating device will be explained in detail with reference to FIG. 2. The plating device, which may be used in the formation process of UBM in the post-treatment process, may be used in the process of forming the redistribution layer.

A plurality of chips, which have yet to be sawn at a wafer level, may be disposed with predetermined intervals between sawing lines. A plating structure (40) for forming the UBM may be formed at the time that the redistribution layer (18) is formed on the semiconductor chip(10), which may still be present at a wafer level.

The plating structure (40) may comprise a plating trace (42) extending from the bonding pad (12) of the chip (10) or the redistribution layer (18) through and beyond an edge of the chip (10) to the sawing line of the wafer; and a plating bar (44) extending along the sawing line of the wafer and integrally connecting each respective plating trace (42) together.

The plating structure (40) as described above may be formed simultaneously with the redistribution layer (18) while performing the electrical plating process.

For this purpose, a first photoresist (22) may be coated over a surface of the semiconductor chip (10) that is still present at a wafer level, that is, the surface of the first passivation film (16). Thereafter, the conventional exposure and development process may be performed so that areas of the semiconductor chip on which the bonding pad (12) and the redistribution layer (18) to be formed may be externally exposed. At the same time, areas on which the plating trace (42), the plating bar (44) and the plating connection line (46) of the plating structure (40) are to be formed may be externally exposed (step S104).

The first seed layer (20) for plating may have already been formed on the bonding pad (12) of the semiconductor chip (10) that is externally exposed, the area on which the redistribution layer is to be formed, and the area on which the plating structure (40) may be formed, by using the sputtering process.

The redistribution layer may then be formed on the areas on which the redistribution layer (18) and the bonding pad (12) of the semiconductor chip (10) are to be formed. At the same time, an electroplating process for forming the plating structure (40) may be performed (step S105).

For example, if an electric current is applied to the first seed layer (20) when the first seed layer (20) is dipped into a solution comprising metal ions, the exposed areas on the surface of the first seed layer (20), which is corresponding to the bonding pad (12) and the redistribution layer (18), may be plated with metal ions, resulting in the formation of the redistribution layer (18) on the surface of the first seed layer (20). At the same time, a plating structure (40) may be provided on the surface of the first seed layer (20).

After the electroplating process has been completed, the first photoresist (22) may be stripped (step S106) and then a part of the first seed layer (20) may be removed by etching, except for the part of the first seed layer (20) beneath the redistribution layer (18) (step S106), thereby completing the redistribution layer (18) having a predetermined surface area and a predetermined length. At the same time, the plating structure (40) to be used in the step of forming the UBM has been completed.

At this time, one end of the redistribution layer (18) may be conductively connected to the bonding pad (12) and the other end of the redistribution layer (18) may extend to a predetermined site on which the input/output terminal (32), such as a solder ball, may be attached.

Next, second passivation film (24) may be formed on upper surfaces of the first passivation film (16) and the redistribution layer (18) (step S107). At this time, the second passivation film (24) may comprise an opening at the other end of the redistribution layer (18) so as to allow the input/output terminal (32) to be attached thereto.

In an example embodiment of the disclosure, the second passivation film (24) may comprise the same materials and be formed using the same method as those used in the process of forming the first passivation film (16). The second passivation layer may function to prevent moisture and other foreign substances from permeating into the redistribution layer (18) and to prevent mechanical shock from being transmitted to the redistribution layer (18). Also, the second passivation layer (24) may function to prevent an electrical short between the redistribution layers.

After the second passivation film (24) is formed, the UBM (30) may be formed, that is, an electrode terminal made of a metal material is formed, at the other end of the redistribution layer (18) using the plating structure (40) (step S108).

More particularly, if an electric current is applied to the plating connection line (46) of the plating structure (40) when a wafer is dipped into a solution comprising metal ions, it is possible to accomplish the conductive connection to the plate trace (42) through the plating bar (44) connected to the conductive connection line (46). Accordingly, the UBM (30) may be coated on the other end of the redistribution layer (18) on which the second passivation film (24) is not provided, that is an area where the UBM is to be formed.

In an example scenario, the UBM (30) may comprise metal materials such as Ni, Au and so on, which may be easily combined with the input/output terminal such as a solder ball. Alternatively, the UBM (30) may comprise other conductive metal materials.

Next, the input/output terminal (32), such as a solder ball, may be melted attaching it to the UBM (30) using a solder reflow process, thereby resulting in the completion of the wafer level package according to the present invention.

Finally, the respective scale package may be completed by sawing the respective chip at a wafer-level along the sawing line. The plating bar (44), including a part extending to the sawing line beyond the edge of the chip of the plating trace (42) of the plating structure (40), may be cut and then removed by means of sawing tool.

As described above, according to the wafer level package of an example embodiment of the present invention as described above, it is possible to reduce the number of sputtering process steps for forming the seed layer in order to form the UBM, the number of patterning processes, exposure processes for the photoresist, stripping processes, and the number of etching processes for the seed layer, thereby resulting in a reduction in the number of manufacturing processes and the manufacturing time. Consequently, this leads to the reduction of the manufacturing cost.

Although an exemplary embodiment of the present invention have been described for illustrative purposes, those skilled in the art will appreciate that various modifications, additions and substitutions are possible, without departing from the scope and spirit of the invention as disclosed in the accompanying claims.

Following is a brief description of the reference numerals:
10: semiconductor chip
12: bonding pad
14: die passivation
16: first passivation film
18: redistribution layer
20: first seed layer
22: first photoresist
24: second passivation film
26: second seed layer
28: second photoresist
30: UBM
32: input/output terminal
40: plating structure
42: plating trace
44: plating bar
46: plating connection line This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

In an example embodiment of the invention, a semiconductor package and manufacturing method thereof is disclosed and may comprise a semiconductor wafer comprising a plurality of semiconductor die and a plating structure for forming an under bump metal on redistribution layers on the plurality of semiconductor die. The plating structure may comprise a plating connection line around a periphery of the semiconductor wafer, and a plating bar coupling the plating connection line to plating traces on the plurality of semiconductor die. The plating traces may be electrically coupled to the redistribution layers on the plurality of semiconductor die. The semiconductor wafer may comprise a reconstituted wafer of said semiconductor die. The semiconductor wafer may comprise a wafer prior to singulating the plurality of semiconductor die. The plating bar may be located in a sawing line for the singulating of the plurality of semiconductor die. A passivation layer may cover the redistribution layer and the plating traces. The under bump metal may be formed in an opening in the passivation layer. The plating structure may comprise an electrode terminal for a plating process for forming the under bump metal. The under bump metal may comprise one or more of nickel, gold, and copper. An input/output terminal may be formed on the under bump metal. The input/output terminal may comprise a solder bump.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A semiconductor device comprising:
   a semiconductor die comprising a passivation layer and a bonding pad exposed by an opening in the passivation layer;
   a patterned seed layer formed on the exposed bonding pad and passivation layer;
   a redistribution layer and a plating structure formed on the patterned seed layer, wherein the plating structure comprises a plating trace extending to an edge of the semiconductor die;
   a second passivation layer formed on the redistribution layer and the plating structure; and
   an under bump metal formed on an exposed portion of the redistribution layer utilizing the plating structure.

2. The semiconductor device according to claim 1, comprising a reconstituted wafer of a plurality of said semiconductor die.

3. The semiconductor device according to claim 1, wherein the plating trace is configured to reach a plating bar at the edge of the semiconductor die.

4. The semiconductor device according to claim 3, wherein the edge of the semiconductor die extends along a sawing line of the plating bar.

5. The semiconductor device according to claim 1, wherein the second passivation layer extends to the under bump metal.

6. The semiconductor device according to claim 5, wherein the under bump metal is formed in an opening in the second passivation layer.

7. The semiconductor device according to claim 1, wherein the plating structure comprises an electrode terminal for a plating process for forming the under bump metal.

8. The semiconductor device according to claim 1, wherein the under bump metal comprises one or more of nickel, gold, and copper.

9. The semiconductor device according to claim 1, wherein an input/output terminal is formed on the under bump metal.

10. The semiconductor device according to claim 9, wherein the input/output terminal comprises a solder bump.

11. A method for a semiconductor device, the method comprising:
    forming a patterned seed layer on an exposed bonding pad and passivation layer on a semiconductor die singulated from a semiconductor wafer;
    forming a redistribution layer and a plating structure on the patterned seed layer, wherein the plating structure comprises a plating trace extending to an edge of the die;
    forming a second passivation layer on the redistribution layer and the plating structure; and
    forming an under bump metal on an exposed portion of the redistribution layer utilizing the plating structure.

12. The method according to claim 11, wherein the semiconductor wafer comprises a plurality of semiconductor die and the plating structure comprises a plating connection line around a periphery of the semiconductor wafer and a plating bar coupling the plating connection line to plating traces on the plurality of semiconductor die.

13. The method according to claim 12, wherein the plating traces are configured to reach a plating bar at the edge of the semiconductor die.

14. The method according to claim 13, wherein the edge of the semiconductor die extends along a sawing line of the plating bar.

15. The method according to claim 11, comprising forming the under bump metal utilizing the plating structure as an electrode terminal in a plating process.

16. The method according to claim 11, comprising forming the under bump metal in an opening formed in the second passivation layer.

17. The method according to claim 11, wherein the under bump metal comprises one or more of nickel, gold, and copper.

18. The method according to claim 11, comprising forming an input/output terminal on the under bump metal.

19. The method according to claim 18, wherein the input/output terminal comprises a solder bump.

20. A semiconductor device comprising:
    a semiconductor wafer comprising a plurality of semiconductor die, said semiconductor wafer comprising a plating structure for forming an under bump metal on redistribution layers on the plurality of semiconductor die, wherein the plating structure is a plating process electrode terminal and comprises:
    a plating connection line around a periphery of the semiconductor wafer; and
    a plating bar coupling the plating connection line to plating traces on the plurality of semiconductor die, wherein the plating traces are electrically coupled to the redistribution layers on the plurality of semiconductor die.

* * * * *